US012624776B1

(12) United States Patent
Ting et al.

(10) Patent No.: US 12,624,776 B1
(45) Date of Patent: May 12, 2026

(54) MANIFOLD CONNECTION DEVICE

(71) Applicant: KUEN TONG INDUSTRIAL CO., LTD., Changhua County (TW)

(72) Inventors: Chung-Hsien Ting, Changhua County (TW); Yi-Cheng Li, Changhua County (TW)

(73) Assignee: KUEN TONG INDUSTRIAL CO., LTD, Changhua County (TW)

( * ) Notice: Subject to any disclaimer, the term of this patent is extended or adjusted under 35 U.S.C. 154(b) by 16 days.

(21) Appl. No.: 18/946,919

(22) Filed: Nov. 14, 2024

(51) Int. Cl.
　　*F16L 13/10* (2006.01)
　　*H05K 7/20* (2006.01)
　　*F28F 9/16* (2006.01)

(52) U.S. Cl.
　　CPC ........ *F16L 13/103* (2013.01); *H05K 7/20272* (2013.01); *H05K 7/20781* (2013.01); *F28F 9/162* (2013.01)

(58) Field of Classification Search
　　CPC ....... F16L 13/103; F16L 41/08; F16L 41/082; F16L 41/10; F28F 9/16
　　See application file for complete search history.

(56) References Cited

U.S. PATENT DOCUMENTS

| | | | | |
|---|---|---|---|---|
| 2,265,703 | A | * | 12/1941 | Simpson ................. F16L 41/10 |
| | | | | 277/606 |
| 2,286,566 | A | * | 6/1942 | Norton .................... F16L 27/04 |
| | | | | 285/272 |

| | | | | |
|---|---|---|---|---|
| 2,915,322 | A | * | 12/1959 | Dunlop ................. E21B 17/042 |
| | | | | 285/333 |
| 3,606,399 | A | * | 9/1971 | Zahuranec .............. F16L 27/06 |
| | | | | 285/220 |
| 4,140,337 | A | * | 2/1979 | Arcella ................... F16L 41/10 |
| | | | | 285/219 |
| 4,712,578 | A | * | 12/1987 | White ..................... F16L 41/03 |
| | | | | 137/271 |
| 5,266,104 | A | * | 11/1993 | Vincent ................. F16L 57/005 |
| | | | | 106/14.44 |
| 5,580,101 | A | * | 12/1996 | Fisher .................... F16L 47/24 |
| | | | | 285/94 |

(Continued)

FOREIGN PATENT DOCUMENTS

| | | | | | |
|---|---|---|---|---|---|
| GB | 1118336 | A | * | 7/1968 | ............. F16L 41/10 |
| GB | 2361273 | A | * | 10/2001 | ............. F16L 15/04 |
| WO | WO-2016113076 | A1 | * | 7/2016 | .......... C09K 3/1018 |

*Primary Examiner* — Matthew Troutman
*Assistant Examiner* — James A Linford
(74) *Attorney, Agent, or Firm* — Apex Juris, pllc; Hilde M. L. Coeckx

(57) ABSTRACT

A manifold connection device includes a locking connector and a manifold having an inner wall and an outer wall. A threaded hole penetrates the inner wall and the outer wall, has an inner thread, and has an axial line identical to a locking direction. The locking connector includes a threaded section and a main section. The threaded section has an end surface and an outer thread. A flange portion is formed between the threaded section and the main section. The outer thread is screwed with the inner thread. The flange portion abuts against the outer wall. The end surface is aligned with the inner wall or protrudes from the inner wall. A ratio of a length between the end surface and the inner wall in the locking direction to a maximum inner diameter of the manifold in the locking direction is 0 or is less than or equal to 0.1.

10 Claims, 9 Drawing Sheets

(56)  References Cited

U.S. PATENT DOCUMENTS

| | | | | |
|---|---|---|---|---|
| 6,866,305 | B2 * | 3/2005 | Spears ................... | F16L 15/08 |
| | | | | 285/329 |
| 10,863,652 | B1 | 12/2020 | Conroy et al. | |
| 2006/0012169 | A1 * | 1/2006 | Williams ............... | F16L 19/14 |
| | | | | 285/249 |
| 2006/0049631 | A1 * | 3/2006 | Tolhoek ................. | F16L 47/16 |
| | | | | 285/374 |
| 2023/0052671 | A1 * | 2/2023 | Stammer .............. | F28F 9/0256 |

* cited by examiner

MANIFOLD CONNECTION DEVICE

BACKGROUND OF THE INVENTION

Technical Field

The present invention relates generally to a connection device of a cooling pipeline, and more particularly to a manifold connection device.

Description of Related Art

A conventional connector is used for supplying a coolant from a manifold to a datacenter electronic component. For example, American patent U.S. Pat. No. 10,863,652 "Self-installing connections for rack liquid cooling" discloses that two manifolds connected to a heat exchanger are disposed in a rack, wherein one of the two manifolds is adapted to transport a coolant to at least one datacenter electronic component, and the other manifold is adapted to receive the coolant that has passed through the at least one datacenter electronic component.

A self-installing connector is connected between each of the manifolds and the at least one datacenter electronic component. The self-installing connector includes a manifold coupling and a component coupling that are detachably connected to each other. The component coupling is fixed to the at least one datacenter electronic component and communicates with a liquid cooling system. When the at least one datacenter electronic component is mounted in a rack, the manifold coupling of the self-installing connector penetrates through the manifold, wherein an opening is formed in the manifold and an end of the manifold coupling is fixed in the opening. As the component coupling and the manifold coupling could be detached from each other, the at least datacenter electronic component is detachable relative to the rack, thereby facilitating the maintenance of the at least one datacenter electronic component.

As the manifold coupling of the self-installing connector is required to pass through the opening, which is formed by the penetration of the manifold coupling, for fixing, a large part of an inner end of the manifold coupling extends into the manifold, so that the self-installing connector forms a protruding portion in the manifold. The protruding portion of the self-installing connector in the manifold interferes with the coolant flowing in the manifold, so that a turbulence of the coolant is resulted around the inner end of the self-installing connector, thereby obstructing the flow of the coolant and trapping heat. As a result, the heat dissipation effect of the coolant is affected.

BRIEF SUMMARY OF THE INVENTION

In view of the above, the primary objective of the present invention is to provide a manifold connection device, wherein a threaded hole is formed on a manifold for screwing with a locking connector; an inner end of the locking connector is either aligned with an inner wall of the manifold or protrudes out of the inner wall; such design could reduce turbulence generated as a liquid flow in the manifold and the locking connector, thereby preventing interference with a heat dissipation effect of a coolant when the manifold is used to transport the coolant.

The present invention provides a manifold connection device including a manifold and a locking connector. A side of the manifold is provided with a connected portion. An inner side of the connected portion is provided with an inner wall. An outer side of the connected portion is provided with an outer wall. The connected portion has a threaded hole. The threaded hole has an inner thread. Two ends of the threaded hole penetrate through the outer wall and the inner wall. A locking direction is defined. The locking direction is identical to an axial line of the threaded hole. The locking connector includes a threaded section, a main section, and a connecting section that are coaxially connected in sequence. An outer diameter of the threaded section is less than an outer diameter of the main section. A flange portion is formed between the threaded section and the main section. The threaded section has an end surface. An outer thread is provided around the threaded section. The outer thread is screwed with the inner thread of the threaded hole. The flange portion abuts against a part of the outer wall adjacent to the threaded hole. The end surface is either aligned with the inner wall or protrudes out of the inner wall. A ratio of a length between the end surface and the inner wall in the locking direction to a maximum inner diameter of the manifold in the locking direction is equal to 0 or is less than or equal to 0.1.

With the aforementioned design, as the ratio of the length between the end surface and the inner wall in the locking direction to the maximum inner diameter of the manifold in the locking direction is equal to 0 or is less than or equal to 0.3, the end surface of the locking connector does not protrude from the inner wall or the length between the end surface of the protruding locking connector and the inner surface in the locking direction is small, thereby reducing the turbulence at the position of the threaded section aligned with the inner wall or protruding from the inner wall. In this way, the resistance of the liquid, such as the coolant, during flowing could be reduced, thereby preventing a decrease of the mobility of the liquid. Therefore, the heat dissipation effect of the coolant is ensured when the manifold connection device is used to transport the coolant.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
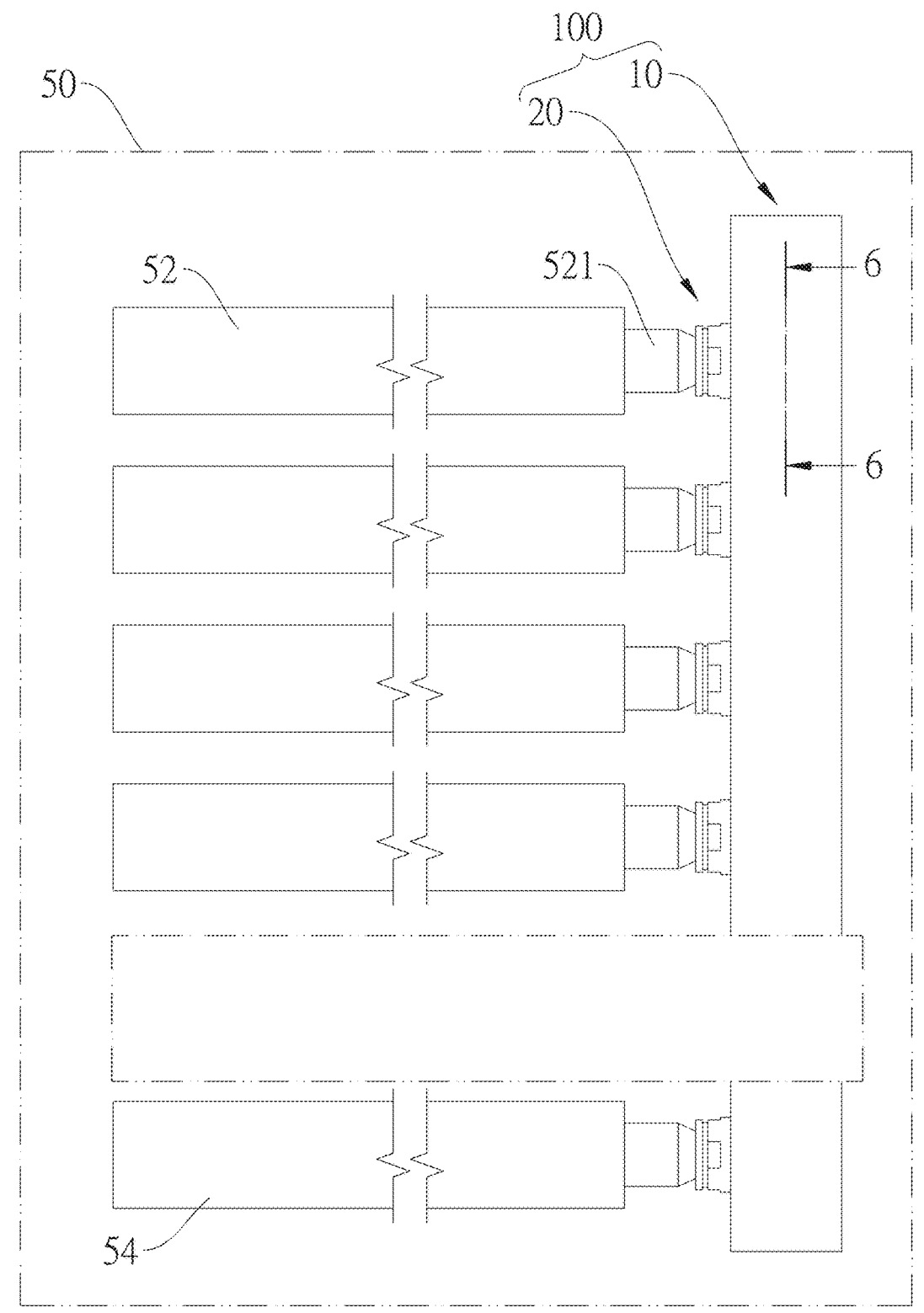
FIG. 1 is a schematic view showing that the manifold connection device according to a first embodiment of the present invention is mounted in the rack of the datacenter.

A manifold connection device 100 according to a first embodiment of the present invention is illustrated in FIG. 1.

The manifold connection device 100 is used in a datacenter as an example. A rack 50 of the datacenter is provided with a plurality of datacenter electronic components 52 and a heat exchanger 54. Each of the datacenter electronic components 52 has a connected tube 521. The manifold connection device 100 is disposed between the connected tube 521 of each of the datacenter electronic components 52 and the heat exchanger 54, so that a coolant flows from each of the datacenter electronic components 52 to the heat exchanger 54 or flows from the heat exchanger 54 to each of the datacenter electronic components 52.

Figure 2:
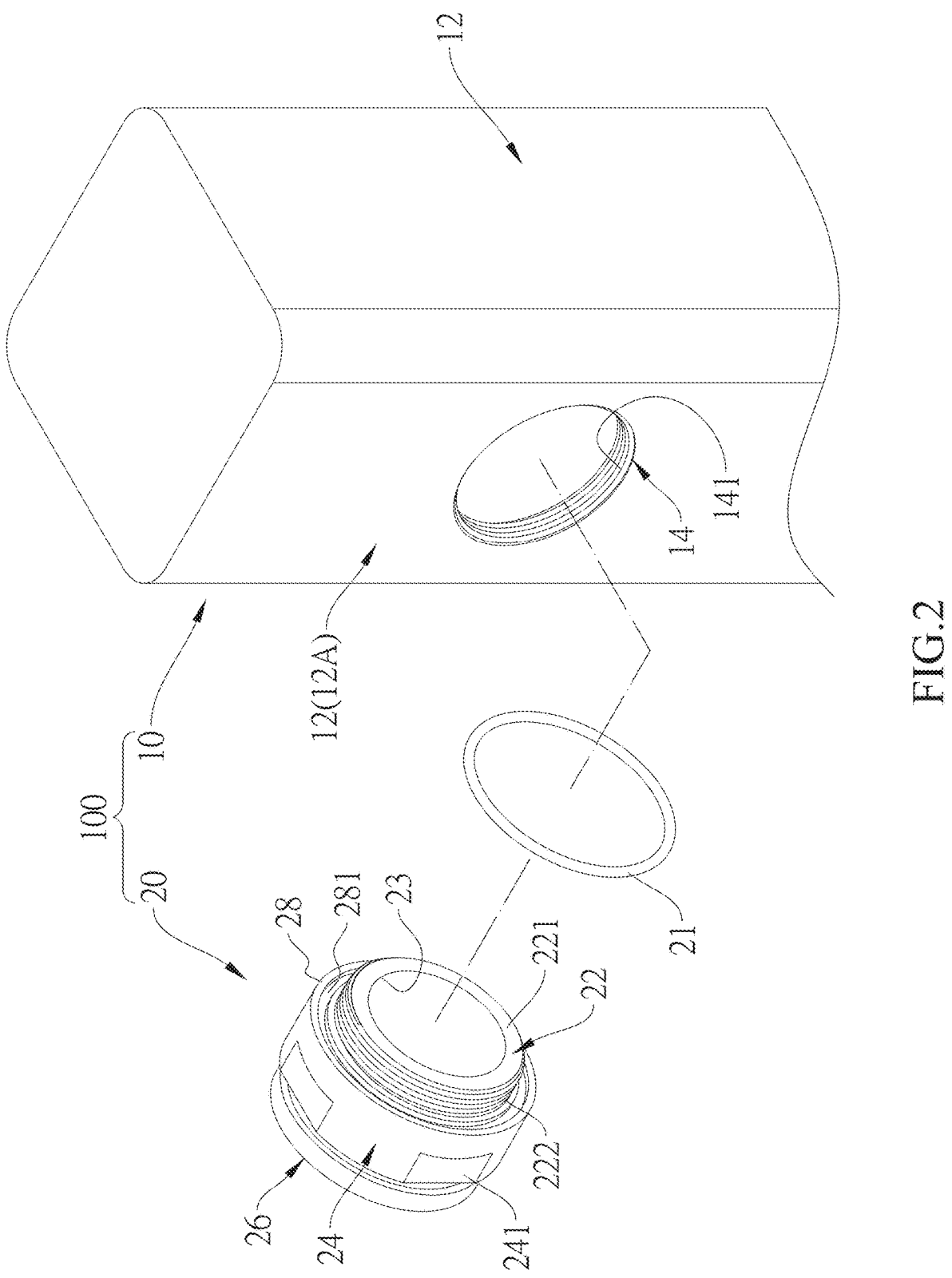
FIG. 2 is an exploded view of the manifold connection device according to the first embodiment of the present invention.
Figure 3:
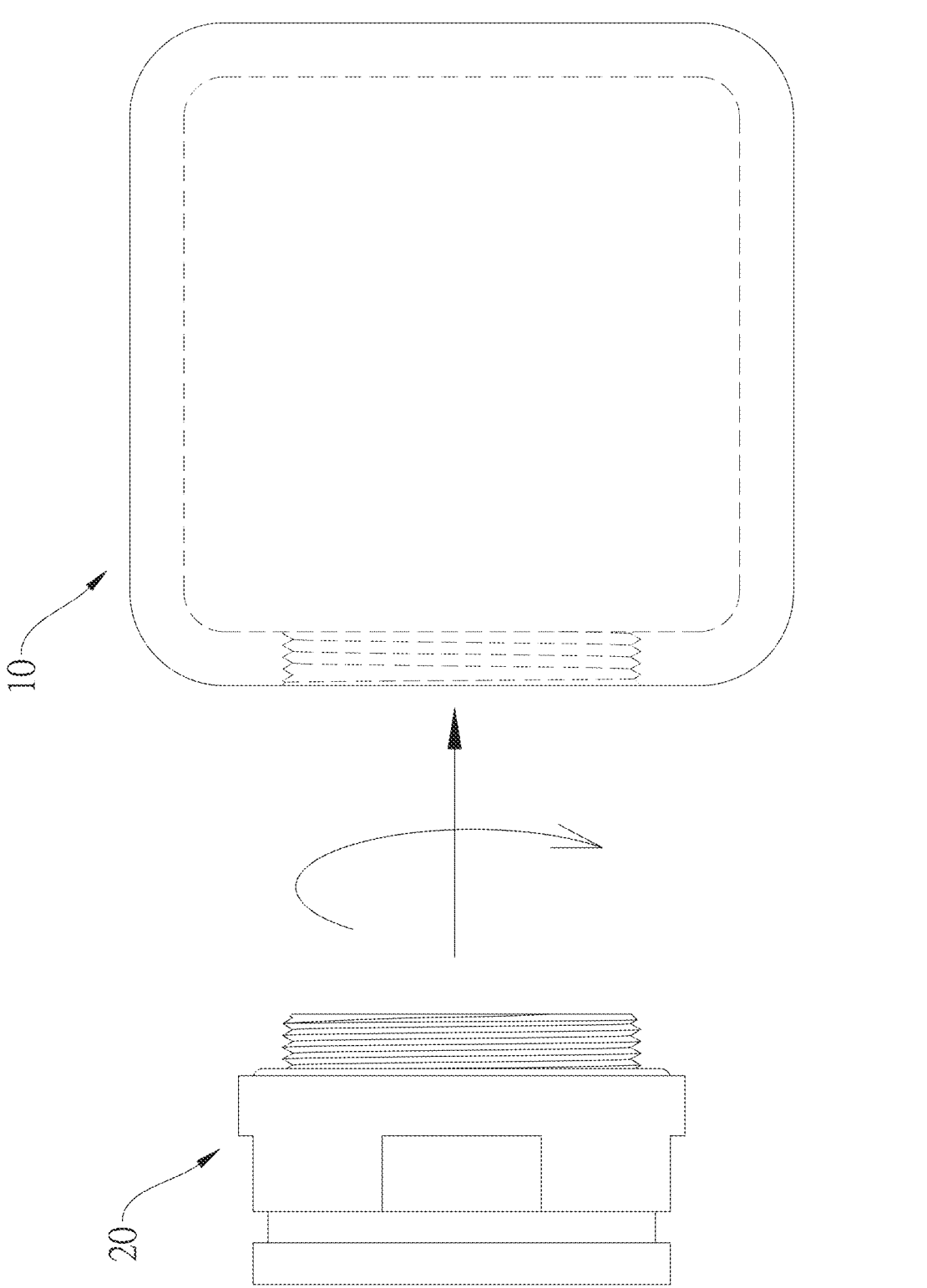
FIG. 3 is schematic top view showing that the locking connector in FIG. 2 is about to mounted on the manifold.
Figure 5:
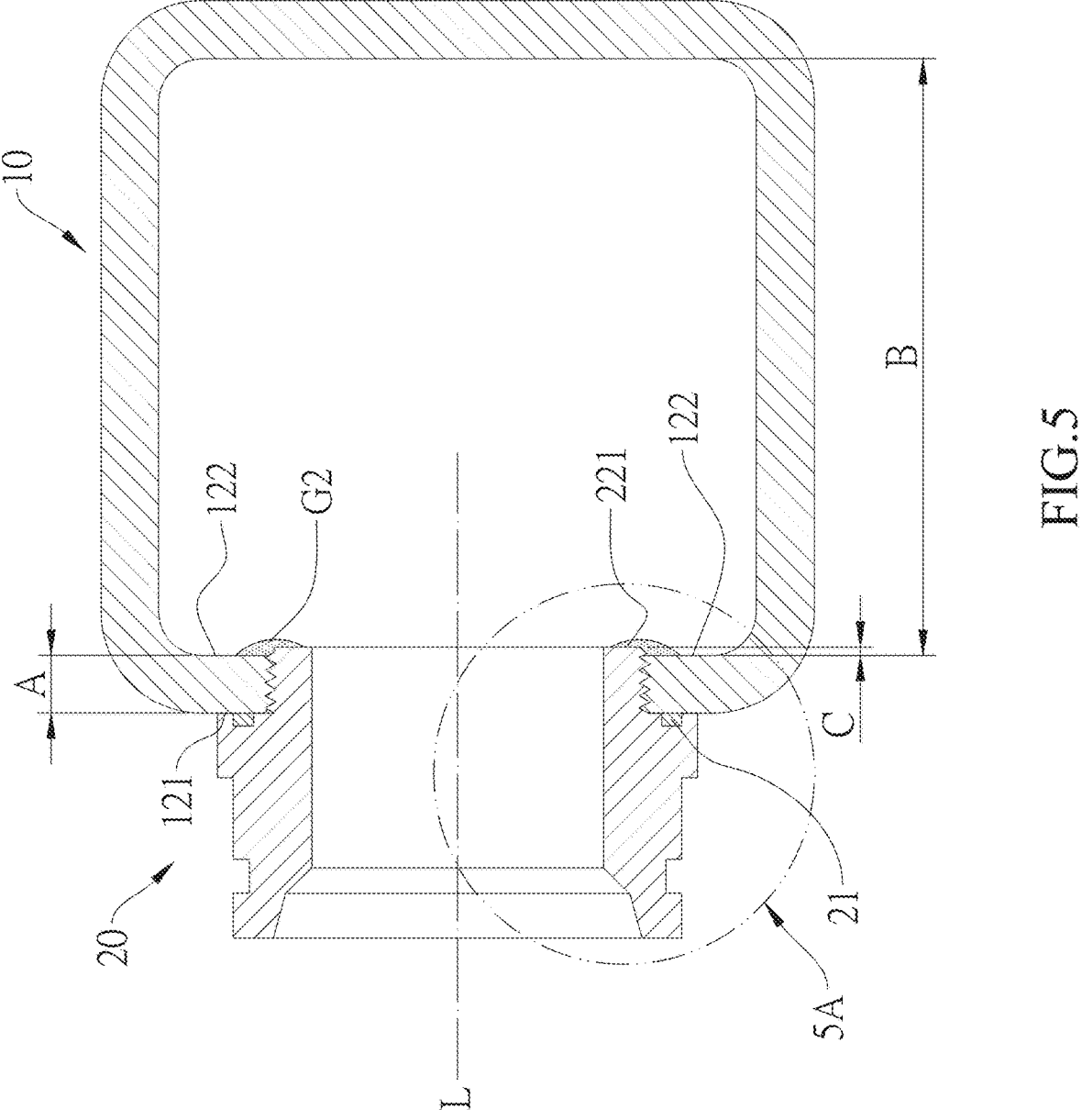
FIG. 5 is a schematic sectional view of the manifold connection device according to the first embodiment of the present invention.
Figure 5A:
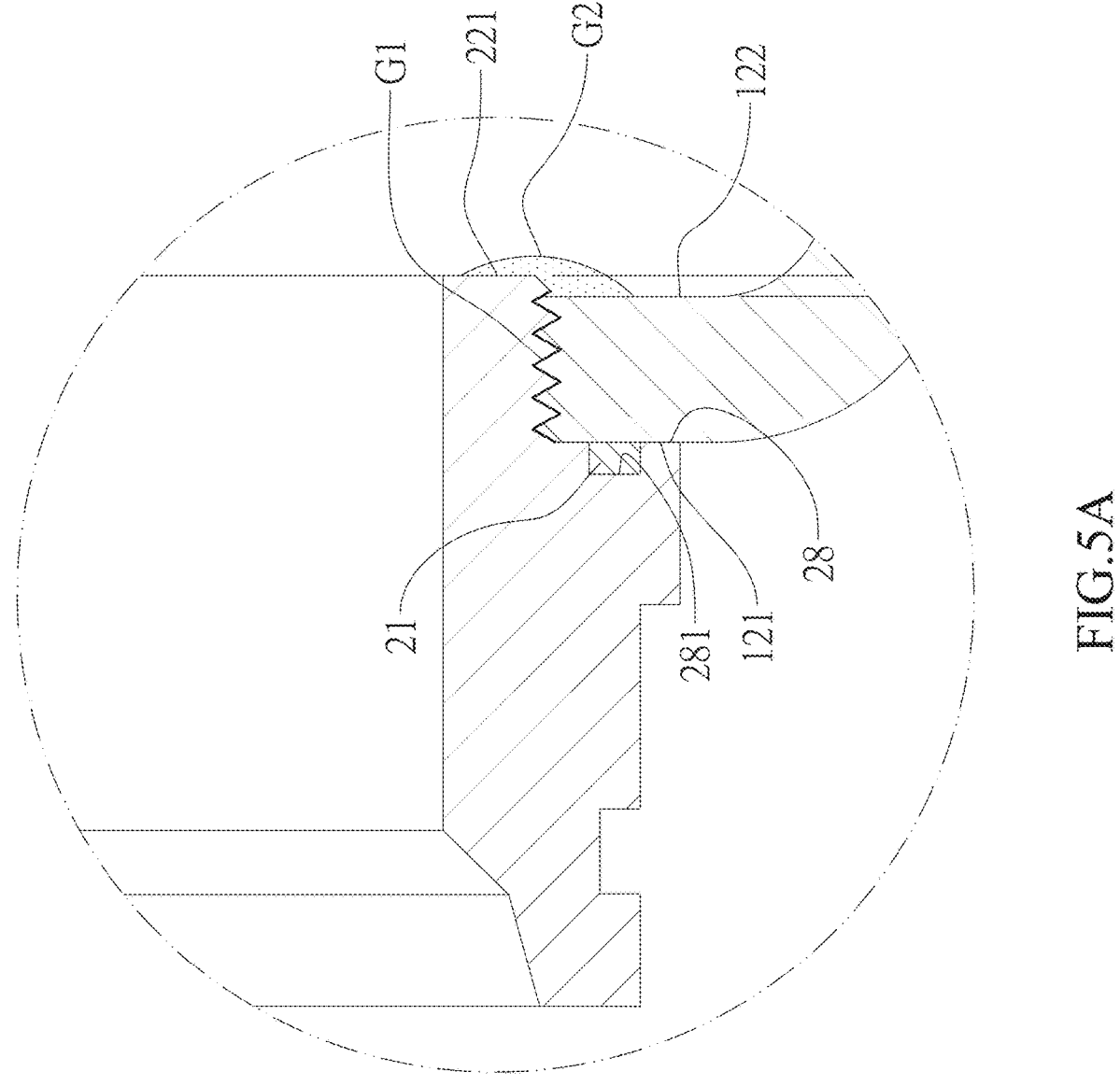
FIG. 5A is a partially enlarged view of a marked region 5A in FIG. 5.

Referring to FIG. 1, FIG. 2, and FIG. 5, the manifold connection device 100 includes a manifold 10 and a locking connector 20 engaged with the manifold 10 by screwing. When the manifold connection device 100 is used in the datacenter, an end of the manifold 10 is connected to the heat exchanger 54, and the locking connector 20 is detachably connected to the connected tube 521 of one of the datacenter electronic components 52.

Figure 4:
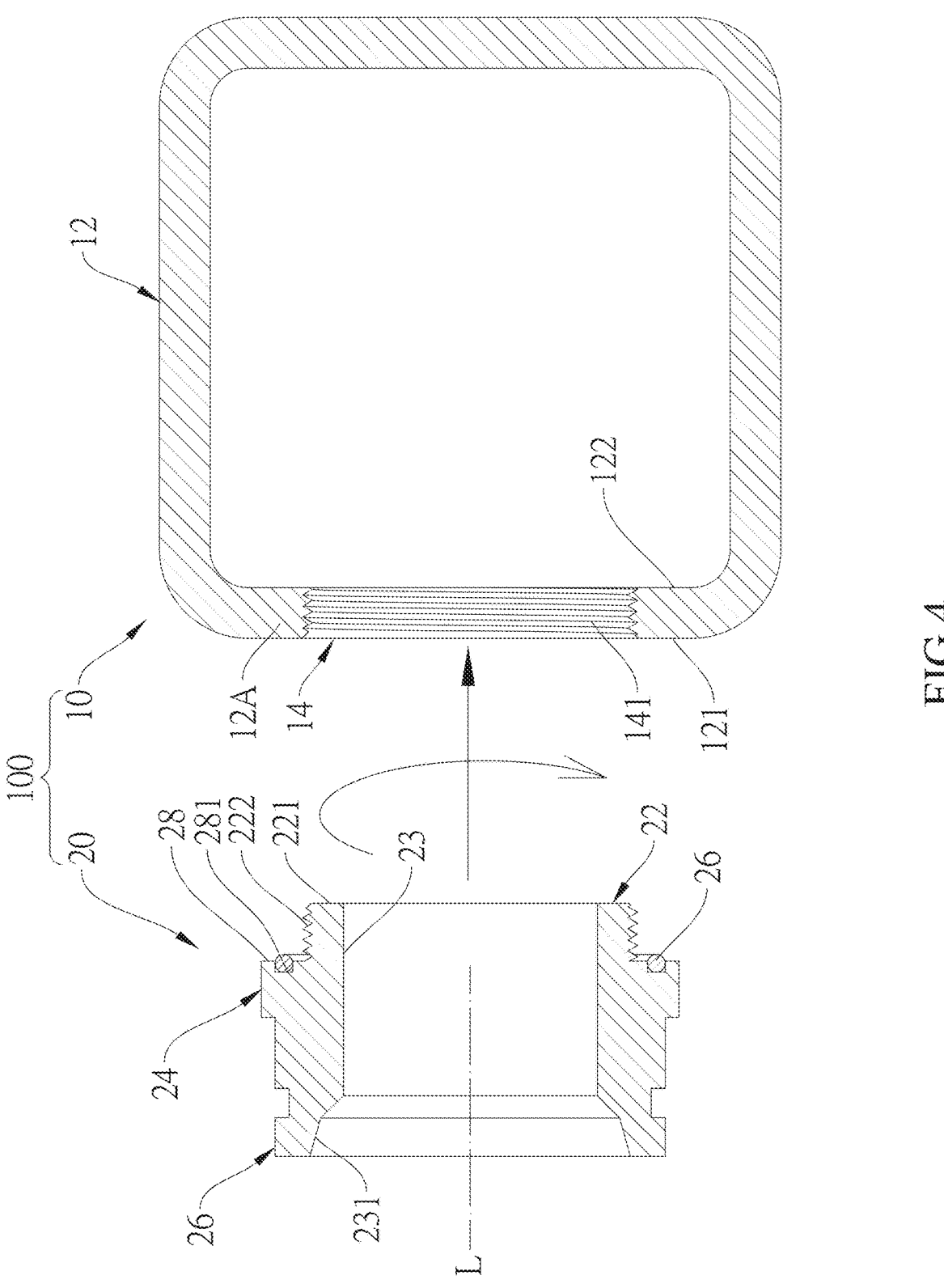
FIG. 4 is a schematic sectional view of FIG. 3.

A cross-section of the manifold 10 is in a rectangular shape. Four plates 12 on four sides of the manifold 10 surround to form the manifold 10. One of the plates 12 on a front side of the manifold 10 forms a connected portion 12A. An inner side and an outer side of the connected portion 12A are provided with an inner wall 122 and an outer wall 121, respectively. Both the outer wall 121 and the inner wall 122 are flat and straight surfaces. The connected portion 12A has a threaded hole 14. Two ends of the threaded hole 14 penetrate through the outer wall 121 and the inner wall 122, respectively. The threaded hole 14 has an inner thread 141. The inner thread 141 is a V-thread. Referring to FIG. 4 and FIG. 5, a locking direction L is defined, wherein the locking direction L and an axial line of the threaded hole 14 are in an identical direction. A length between the outer wall 121 and the inner wall 122 in the locking direction L is defined as a wall thickness A. A maximum inner diameter of the manifold 10 in the locking direction L is defined as a maximum inner diameter B.

Referring to FIG. 2 to FIG. 5, the locking connector 20 includes a threaded section 22, a main section 24, and a connecting section 26 that are coaxially connected in sequence. The threaded section 22 has an end surface 221, wherein an outer thread 222 is provided around the threaded section 22. The outer thread 222 is a V-thread. An outer diameter of the threaded section 22 is less than an outer diameter of the main section 24. A flange portion 28 is formed between the threaded section 22 and the main section 24. A groove 281 is formed on the flange portion 28. A seal ring 21 is disposed on the groove 281. An outer peripheral surface of the main section 24 is provided with a plurality of clamping surfaces 241. The clamping surfaces 241 are provided around the outer peripheral surface of the main section 24 and are arranged by intervals. A through hole 23 is provided in the locking connector 20. A part of the through hole 23 corresponding to the connecting section 26 forms a tapered portion 231. Referring to FIG. 1 and FIG. 4, the tapered portion 231 is connected to the connected tube 521 of the datacenter electronic component 52 by abutting against the connected tube 521.

Figure 6:
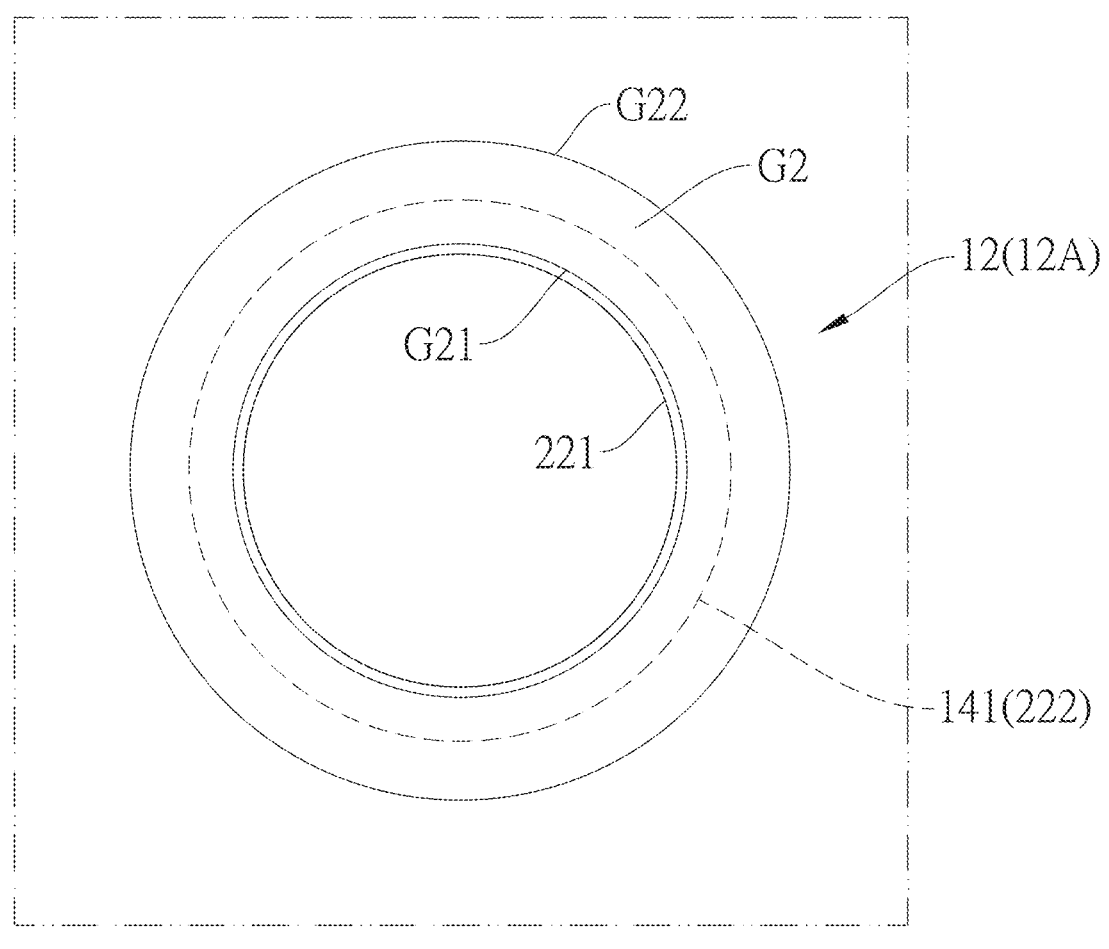
FIG. 6 is a sectional view along the 6-6 line in FIG. 1.

Referring to FIG. 4 to FIG. 6, when the locking connector 20 is screwed with the manifold 10, an adhesive is applied on the threaded section 22 and the outer thread 222 of the threaded section 22 is screwed with the inner thread 141 of the threaded hole 14 until the flange portion 28 abuts against a part of the outer wall 121 adjacent to the threaded hole 14; the seal ring 21 is clamped between the groove 281 and the part of the outer wall 121 adjacent to the threaded hole 14;

eventually, the through hole 23 communicates with an inner portion of the manifold 10. As the seal ring 21 is compressed to abut against the part of the outer wall 121 adjacent to the threaded hole 14, a leakage of a liquid between the flange portion 28 and the outer wall 121 could be prevented. Moreover, as a resilience of the seal ring 21 due to an elasticity of the seal ring 21 is in a direction identical to the locking direction L, a friction between the outer thread 222 of the locking connector 20 and the threaded hole 14 during screwing could be increased, thereby preventing the locking connector 20 from being detached relative to the threaded hole 14.

A length between the end surface 221 and the inner wall 122 in the locking direction L is defined as a protruding length C. In the current embodiment, the end surface 221 slightly protrudes out of the inner wall 122; the protruding length C is less than or equal to 1 mm; a ratio of the protruding length C to the wall thickness A is less than or equal to 0.1; a ratio of the protruding length C to the maximum inner diameter B is less than or equal to 0.01. In other embodiments, the end surface 221 could be aligned with the inner wall 122, i.e., the protruding length C is equal to 0 mm; at that time, the ratio of the protruding length C to the wall thickness A is equal to 0; the ratio of the protruding length C to the maximum inner diameter B is equal to 0. Alternatively, the protruding length C could be less than or equal to 2 mm or could be less than or equal to 3 mm; the ratio of the protruding length C to the wall thickness A could be less than or equal to 0.5 or could be less than or equal to 0.9; the ratio of the protruding length C to the maximum inner diameter B could be less than or equal to 0.1, could be less than or equal to 0.03, could be less than or equal to 0.05, or could be less than or equal to 0.1.

Referring to FIG. 1, FIG. 5, and FIG. 6, as the protruding length C is small, the ratio of the protruding length C to the wall thickness A is small, or the ratio of the protruding length C to the maximum inner diameter B is small, a length of the end surface 221 of the locking connector 20 protruding out of the inner wall 122 is small. Therefore, when the coolant flows through the datacenter electronic components 52, the manifold connection device 100, and the heat exchanger 54, turbulence is unlikely to occur at a position of the threaded section 22 protruding out of the inner wall 122, so that a resistance hindering the flow of the coolant could be reduced and a mobility of the coolant could be prevented from being reduced, thereby ensuring a good heat dissipation effect of the coolant.

The adhesive is solidified between the inner thread 141 and the outer thread 222 to form an adhesive layer G1. A part of the adhesive is excessive and is provided on the end surface 221, so that an excessive adhesive structure G2 is adhered to the end surface 221 and a part of the inner wall 122 adjacent to the threaded hole 14. The excessive adhesive structure G2 is formed by solidifying the excessive adhesive, wherein a surface of the excessive adhesive structure G2 is smooth. The excessive adhesive structure G2 is annular and is connected to the adhesive layer G1. The excessive adhesive structure G2 has an inner peripheral edge G21 and an outer peripheral edge G22. The inner peripheral edge G21 is connected to the end surface 221. The outer peripheral edge G22 is connected to the part of the inner wall 122 adjacent to the threaded hole 14.

As the adhesive layer G1 fills a gap between the inner thread 141 and the outer thread 222, the liquid, such as the coolant, could be prevented from leaking via the gap between the inner thread 141 and the outer thread 222. By the excessive adhesive structure G2 covering the gap between the inner thread 141 and the outer thread 222, the liquid, such as the coolant, could be prevented from leaking via the gap between the inner thread 141 and the outer thread 222. The excessive adhesive structure G2 covers between the end surface 221 and the inner wall 122 and the surface of the excessive adhesive structure G2 is smooth, so that a smooth incline is formed between a periphery of the end surface 221 and the inner wall 122, thereby reducing a turbulence generated while the liquid flows through. In this way, a resistance for the liquid to pass through the smooth incline is reduced, thereby preventing the reduction of the mobility of the coolant.

In order to accelerate the formation of the adhesive layer G1 and/or the excessive adhesive structure G2, a portion of the manifold connection device 100 around the threaded hole 14 could be heated by a heat gun or an oven at a low temperature (higher than room temperature and lower than 120° C.) after the locking connector 20 is screwed with the manifold 10, so that the adhesive adhered between the inner thread 141 and the outer thread 222 and/or the excessive adhesive adhered between the end surface 221 and the inner wall 122 are/is rapidly solidified to form the adhesive layer G1 and/or the excessive adhesive structure G2. Alternatively, by placing the manifold 10 and the locking connector 20 at rest at room temperature for a period of time, the adhesive between the inner thread 141 and the outer thread 222 and the excessive adhesive between the end surface 221 and the inner wall 122 are/is solidified to form the adhesive layer G1 and/or the excessive adhesive structure G2. Moreover, in order to increase the screwing friction between the outer thread 222 of the locking connector 20 and the inner thread 141 of the threaded hole 14, a surface of the outer thread 222 and/or a surface of the inner thread 141 could be roughened to form a roughened surface, so that the friction between the outer thread 222 and the inner thread 141 during screwing is increased, thereby preventing the locking connector 20 from being detached relative to the threaded hole 14.

Figure 7:
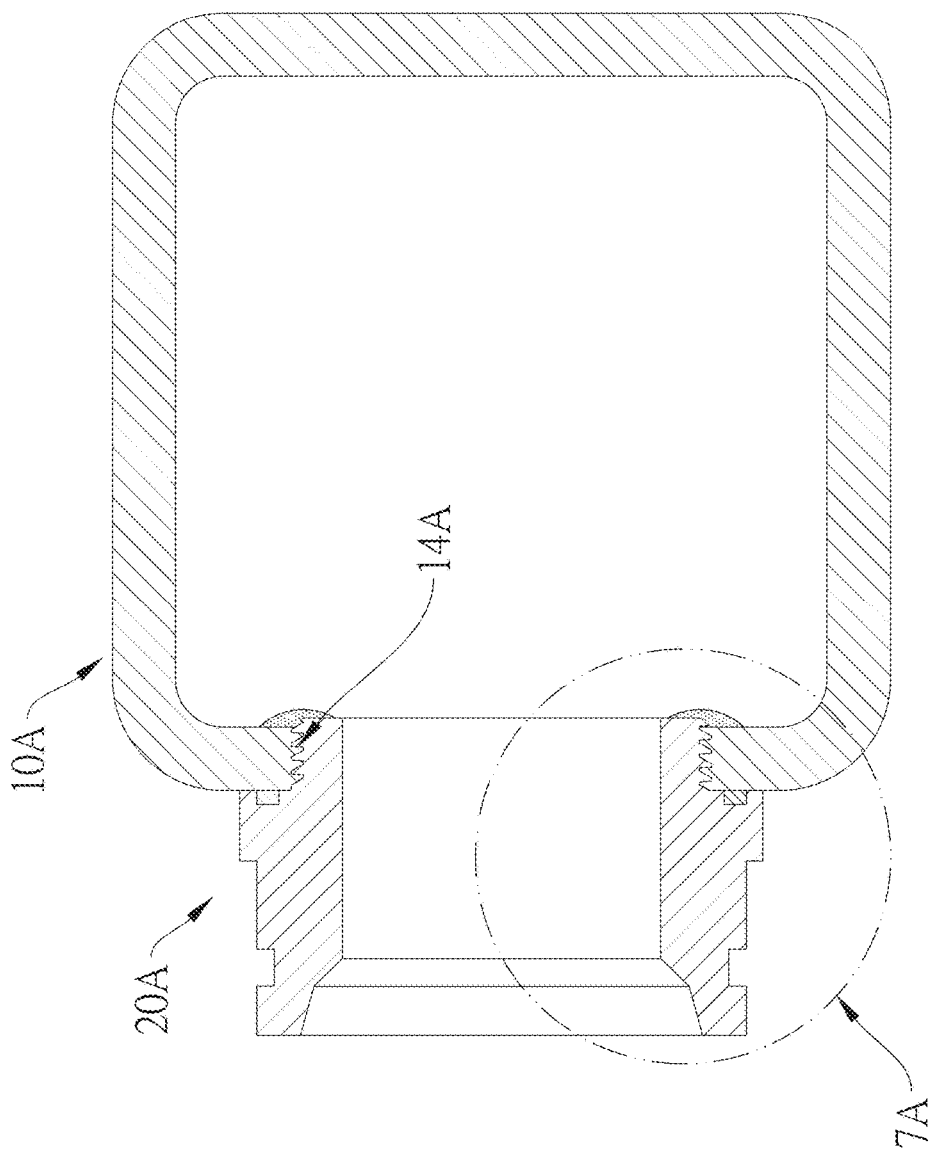
FIG. 7 is a schematic sectional view of the manifold connection device according to a second embodiment of the present invention.
Figure 7A:
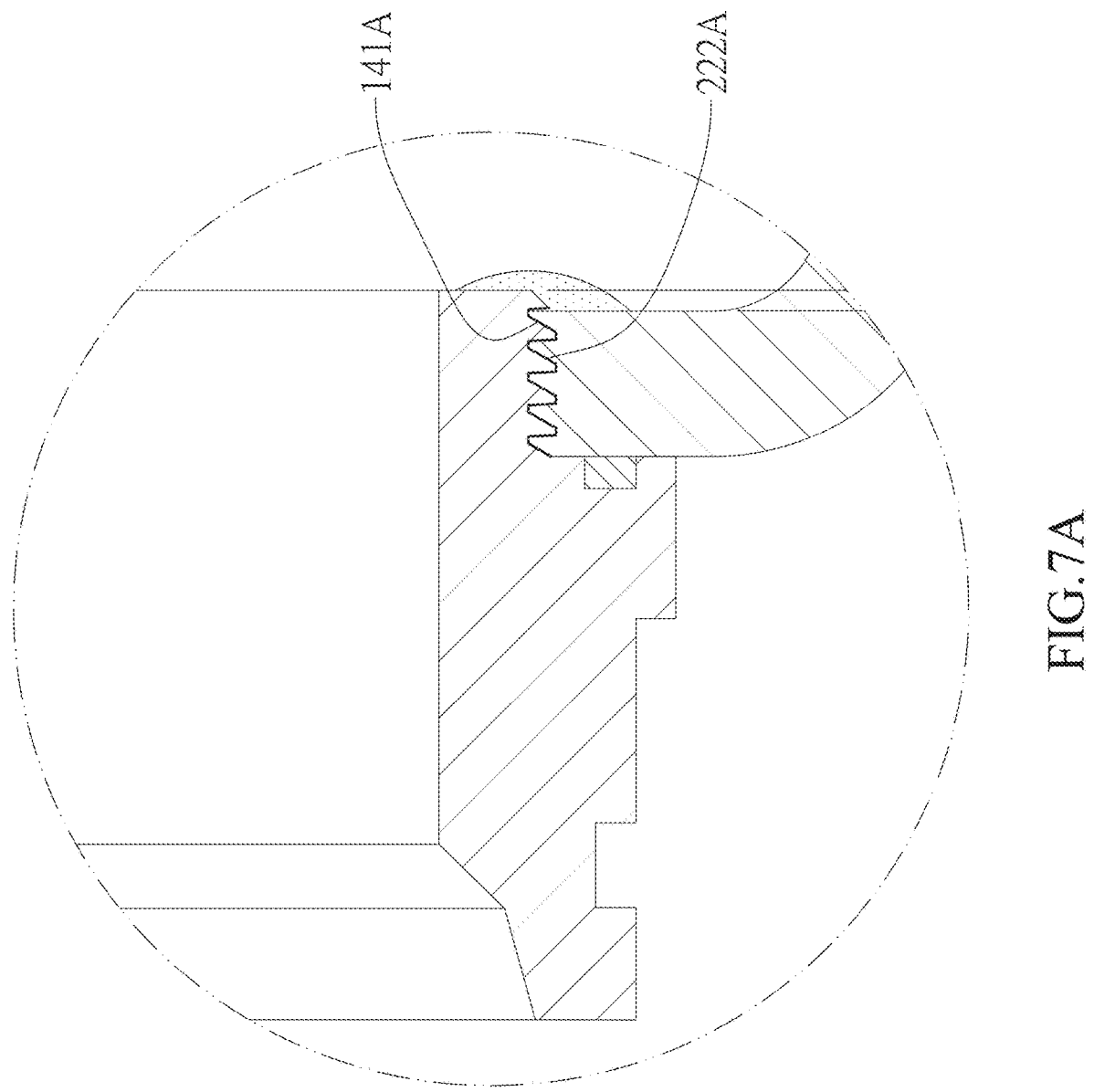
FIG. 7A is a partially enlarged view of a marked region 7A in FIG. 7.

In the first embodiment, the inner thread 141 of the threaded hole 14 of the manifold 10 is a V-thread, and the outer thread 222 of the locking connector 20 screwed with the threaded hole 14 is also a V-thread. A second embodiment of the present invention is illustrated in FIG. 7 and FIG. 7A and has almost the same structure as that of the first embodiment, except that in the second embodiment, an inner thread 141A of a threaded hole 14A of a manifold 10A is a sawtooth thread, and an outer thread 222A of a locking connector 20A screwed with the threaded hole 14A is also a sawtooth thread. In this way, when the outer thread 222A of the locking connector 20A is screwed with the inner thread 141A of the threaded hole 14A of the manifold 10A, a larger friction is provided between the outer thread 222A and the inner thread 141A, thereby further preventing the locking connector 20A from being detached relative to the threaded hole 14A of the manifold 10A.

It must be pointed out that the embodiments described above are only some preferred embodiments of the present invention. All equivalent structures which employ the concepts disclosed in this specification and the appended claims should fall within the scope of the present invention.

What is claimed is:

1. A manifold connection device, comprising:
a manifold, wherein a side of the manifold is provided with a connected portion; an inner side of the connected portion is provided with an inner wall; an outer side of the connected portion is provided with an outer wall; the connected portion has a threaded hole; the threaded hole has an inner thread; two ends of the threaded hole penetrate through the outer wall and the inner wall, respectively; a locking direction is defined; the locking direction is identical to an axial line of the threaded hole; and a locking connector comprising a threaded section, a main section, and a connecting section that are coaxially connected in sequence; an outer diameter of the threaded section is less than an outer diameter of the main section; a flange portion is formed between the threaded section and the main section; the threaded section has an end surface; an outer thread is provided around the threaded section; the outer thread is screwed with the inner thread of the threaded hole; the flange portion abuts against a part of the outer wall adjacent to the threaded hole; the end surface is either aligned with the inner wall or protrudes out of the inner wall; a ratio of a length between the end surface and the inner wall in the locking direction to a maximum inner diameter of the manifold in the locking direction is equal to 0 or is less than or equal to 0.1;
wherein an adhesive layer is provided between the inner thread and the outer thread; an adhesive structure is adhered to the end surface and a part of the inner wall adjacent to the threaded hole; the adhesive structure is annular and is connected to the adhesive layer.

2. The manifold connection device as claimed in claim 1, wherein the length between the end surface and the inner wall in the locking direction is greater than or equal to 0 mm and is less than or equal to 3 mm.

3. The manifold connection device as claimed in claim 2, wherein a ratio of the length between the end surface and the inner wall in the locking direction to a length between the outer wall and the inner wall in the locking direction is less than 0 or less than or equal to 0.9.

4. The manifold connection device as claimed in claim 1, wherein the adhesive structure has an inner peripheral edge and an outer peripheral edge; the inner peripheral edge is connected to the end surface; the outer peripheral edge is connected to the part of the inner wall adjacent to the threaded hole.

5. The manifold connection device as claimed in claim 1, wherein a groove is formed on the flange portion; a seal ring is disposed on the groove; the seal ring abuts against the part of the outer wall adjacent to the threaded hole.

6. The manifold connection device as claimed in claim 1, wherein the outer thread is a sawtooth thread.

7. The manifold connection device as claimed in claim 1, wherein a surface of the outer thread and/or a surface of the inner thread are/is a roughened surface.

8. The manifold connection device as claimed in claim 1, wherein a cross-section of the manifold is in a rectangular shape; the connected portion is provided on a plate on a front side of the manifold; both the outer wall and the inner wall are flat and straight surfaces.

9. The manifold connection device as claimed in claim 1, wherein an outer peripheral surface of the main section is provided with a plurality of clamping surfaces; the plurality of clamping surfaces are provided around the outer peripheral surface of the main section and are arranged by intervals.

10. The manifold connection device as claimed in claim 1, wherein a through hole is provided in the locking connector; the through hole communicates with an inner portion of the manifold; a part of the through hole corresponding to the connecting section forms a tapered portion.

* * * * *